United States Patent
Gamel et al.

[19]

[11] Patent Number: 6,085,407
[45] Date of Patent: Jul. 11, 2000

[54] COMPONENT ALIGNMENT APPARATUSES AND METHODS

[75] Inventors: Darryl L. Gamel; Kreg W. Hines, both of Boise, Id.

[73] Assignee: Micron Technology, Inc., Boise, Id.

[21] Appl. No.: 08/915,862

[22] Filed: Aug. 21, 1997

[51] Int. Cl.$^7$ .................................................. H05K 3/30
[52] U.S. Cl. ............................. 29/712; 29/721; 29/833; 29/834; 356/394; 356/375; 356/399; 364/468.28; 364/468.21
[58] Field of Search .......................... 29/707, 712, 721, 29/720, 759, 760, 833, 834, 836; 901/47; 356/394, 375, 399; 364/468.28, 468.21

[56] References Cited

U.S. PATENT DOCUMENTS

| | | | |
|---|---|---|---|
| 2,693,872 | 11/1954 | Baader | 198/376 |
| 2,973,109 | 2/1961 | Gable | 414/27 |
| 3,143,201 | 8/1964 | Wyle et al. | 198/383 |
| 3,207,904 | 9/1965 | Heinz | 356/150 |
| 4,809,430 | 3/1989 | Maruyama et al. | 29/834 |
| 4,914,809 | 4/1990 | Fukai et al. | 29/740 |
| 5,034,802 | 7/1991 | Liebes, Jr. et al. | |
| 5,040,291 | 8/1991 | Janisiewicz et al. | 29/840 |
| 5,377,405 | 1/1995 | Sakurai et al. | 29/833 |
| 5,420,691 | 5/1995 | Kawaguchi | 356/375 |
| 5,477,309 | 12/1995 | Ota et al. | 355/67 |
| 5,606,793 | 3/1997 | Gross et al. | 29/760 |
| 5,621,813 | 4/1997 | Brown et al. | 382/151 |

FOREIGN PATENT DOCUMENTS

| | | | |
|---|---|---|---|
| 195 03 075 A1 | 8/1996 | Germany. | |
| 0514975 A1 | 11/1992 | WIPO | 29/712 |

*Primary Examiner*—Lee Young
*Assistant Examiner*—Bobby Rushing, Jr.
*Attorney, Agent, or Firm*—Kirkpatrick & Lockhart LLP

[57] ABSTRACT

Apparatuses and methods are disclosed for determining the alignment of leads on components. Physical and/or superficial fiducial markers on components are used to distinguishes the alignment of leads on the component. The alignment of fiducial markers on the component are detected. A predetermined fiducial alignment is provided that corresponds to a predetermined lead alignment. The detected fiducial alignment is compared to a predetermined fiducial alignment to determine the lead alignment. When used in conjunction with a pick and place machine, the methods and apparatuses provide a means for verifying and correcting the lead alignment of components prior to placement and attachment to a substrate.

7 Claims, 4 Drawing Sheets

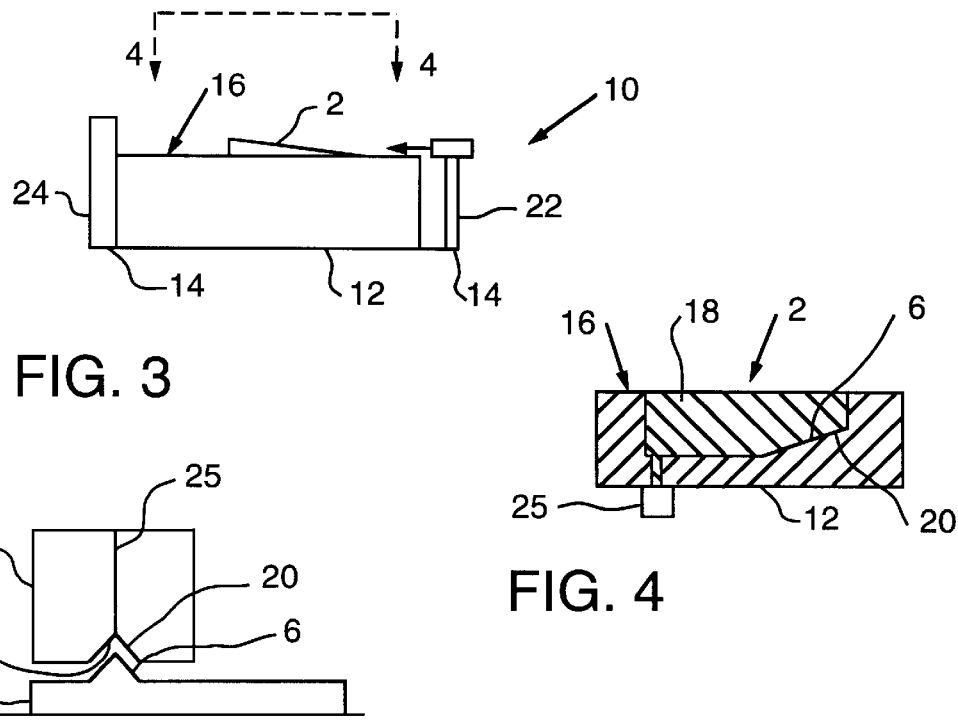
FIG. 3
FIG. 4
FIG. 5
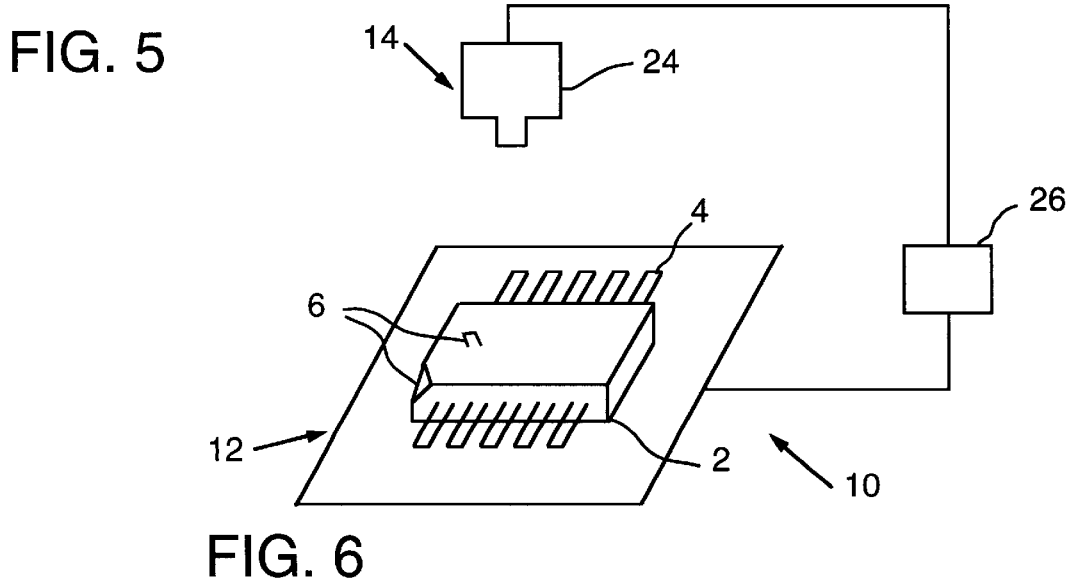
FIG. 6

COMPONENT ALIGNMENT APPARATUSES AND METHODS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates generally to detecting the orientation of a body. More particularly, the present invention relates to alignment apparatuses and methods for determining whether leads on a semiconductor package are aligned in a predetermined alignment prior to placement on and attachment to a substrate. The invention can be generally used in conjunction with or integral to pick and place machines, such as surface mount placement machines, die attach machines, tape and reel production machines, wire bond machines, and the like, to verify proper lead alignment on components being placed by the machines.

Solid state electrical devices are typically produced by attaching a plurality of miniaturized electrical components to a common substrate, such as a printed circuit board. The proper performance of the device is dependent upon the precise placement of each electrical component on the substrate.

The placement of electrical components on a substrate is commonly performed using machines generally known as pick and place machines. Pick and place machines typically employ a number of movable heads each having a nozzle through which a negative pressure, preferably a vacuum, is applied to pick a component from a feed source, such as a continuous tape and reel assembly. The pick and place machine controls the movement of each head to precisely place the components on a substrate, after which the vacuum or suction is released.

Commonly, pick and place machines incorporate sensor systems that detect whether a component is properly aligned in a predetermined angular orientation prior to placing. Examples of such systems are discussed in U.S. Pat. Nos. 5,040,291 issued to Janisiewicz ("'291 patent") and 5,377,405 issued to Sakurai et al.

Other placement systems ensure alignment of the component by providing either a recessed surface in a substrate shaped to receive the component or mating surfaces on the component and the substrate. For example, See U.S. Pat. No. 5,034,802 issued to Liebes, et al. (the "'802 patent"). The '802 patent also discloses the use of an alignment jig for aligning a component prior to picking and placing the component on the substrate. The alignment jigs employ large recesses that are tapered down to the dimensions of the component. The large tapered recess allows the components to be placed less precisely in the jig. The taper on the jig then serves to essentially "funnel" the components into a precise alignment.

A problem exists with the aforementioned alignment methods when used with traditional rectangular shaped components having leads extending from two opposing sides. If the component is 180° out of alignment, the leads will appear to be properly aligned using the above methods. A component that has its leads attached 180° out of alignment will generally function improperly at a minimum and may result in damage to the component and/or other components connected to the component. The obvious exception is a component that is designed to employ mirror image lead connections, which is not the typical design.

This problem is further complicated by components that are designed to have symmetric leads on more than two sides, such as a square shaped component. A 90° rotation of a square shaped component in the plane of the leads will result in a lead misalignment that is undetectable using prior art methods.

The misalignment of leads on aligned components is a defective condition that is presently not detectable using general component orientation systems of the prior art. Thus, the present invention is directed to detecting the misalignment of lead components irrespective of the general orientation of the component to provide apparatuses and methods that can be used to determine the lead alignment of components prior to placement on and attachment to a substrate.

BRIEF SUMMARY OF THE INVENTION

The above objectives and others are accomplished by methods and apparatuses in accordance with the present invention. A method of the present invention contemplates placing a component having leads to a substrate by providing a fiducial marker on a component to be placed on a substrate that uniquely distinguishes the alignment of leads on the component. The alignment of the fiducial marker on the component is detected and compared to a predetermined fiducial alignment corresponding to a predetermined lead alignment. The component is placed on the substrate when the detected fiducial alignment corresponds to the predetermined fiducial alignment. In addition, a component that has misaligned leads can be discarded or the alignment of the components can be properly realigned in accordance with an alignment offset.

Apparatuses of the present invention can be operated in conjunction with or integral to various pick and place machines, such as surface mount placement machines, die attach machines, tape and reel production machines, and wire bond machines. Generally, the apparatus includes a nest for receiving a component and detector positioned to detect whether leads on the component in the nest are properly aligned and provide a signal indicative of the alignment. In a preferred embodiment, a physically asymmetric fiducial marker is provided on the component and a correspondingly asymmetric recess in provide in a surface of the nest. The detector is positioned to detect whether the asymmetric portions of the component and the nest mate. In another embodiment, a receiver is positioned in a pick and place machine relative to the feed source to detect the alignment of the leads on a component prior to the component being fed to a pick station for placement on a substrate.

Accordingly, the present invention overcomes the aforementioned problems to provide apparatuses and methods that provide the ability to determine, verify, and/or correct the alignment of leads on components prior to placing the components on a substrate. These advantages and others will become apparent from the following detailed description.

BRIEF DESCRIPTION OF THE DRAWINGS

Preferred embodiments of the invention will now be described, by way of example only, with reference to the accompanying Figures wherein like members bear like reference numerals and wherein:

FIG. 3 shows a side view along the line 3—3 shown in FIG. 2 and including a misaligned component seated in the recess in the nest;

FIG. 4 is a cross section of the nest shown in FIG. 3 along the line 4—4, but with a properly aligned component seated in the recess of the nest;

FIG. 5 shows an alternative embodiment of the device for detecting a physical asymmetry on the component;

FIG. 6 is a perspective view of an apparatus of the present invention including a component having both superficial and physically asymmetric marks; and, FIG. 7 is a further example of a pick and place apparatus incorporating the present invention.

DETAILED DESCRIPTION OF THE INVENTION

Figure 1A:
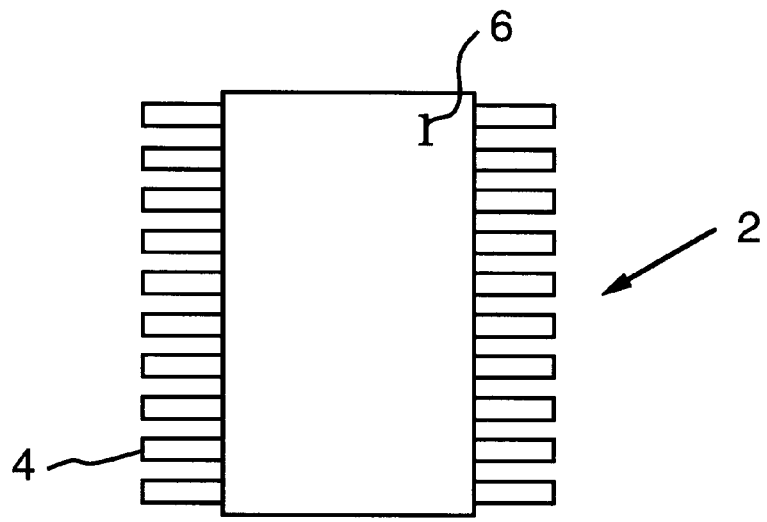
Figs. 1(a) & 1(b) show two lead arrangements on components including fiducial markers that can be aligned using the present invention.
Figure 1B:
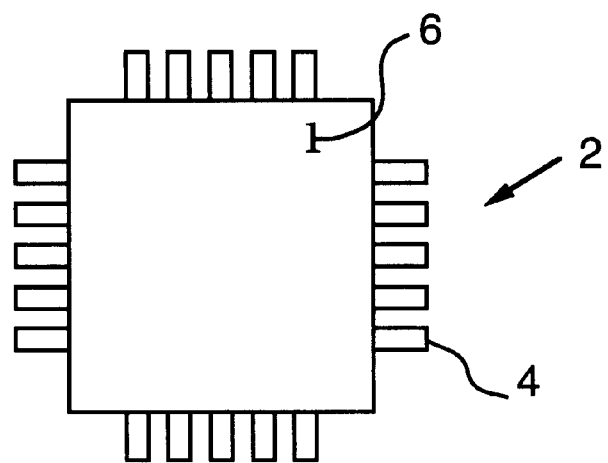

An apparatus 10 embodying the present invention will be described generally with reference to the drawings for the purpose of illustrating the present preferred embodiments of the invention only and not for purposes of limiting the same. The apparatus 10 generally includes a nest 12 and a detector 14. The nest 12 and detector 14 are used in combination with a component 2 having leads 4 by providing a fiducial marker 6 on the component 2, as shown in FIGS. 1(a)&(b), to determine or verify whether the leads 4 are properly aligned prior to placing the component 2 on a substrate 8. The fiducial marker 6 is provided on the component 2 in such a way to uniquely distinguish the alignment of the leads 4. Unless specifically stated, the term "fiducial marker" is meant to include any number and all types of marks that serve the distinguishing function, discussed above, either in isolation or combination. Such marks may include, but are not limited to, geometric shapes or characters that superficially and/or structurally alter the appearance of the component 2.

In a preferred embodiment, the nest 12 includes a nest surface 16 containing an asymmetric recess 18 that corresponds to a component having a physically asymmetric fiducial marker 6. Physically corresponding fiducial markers 6 and nests 12 are currently preferred due, in part, to the fact that most semiconductor components are manufactured with a physical asymmetry to facilitate post-production troubleshooting operations. Therefore, the manufacturing process for many components does not have to be modified to work with the present invention.

Many electrical components are currently manufactured with a physically asymmetric beveled edge that provides a convenient way for inspection and maintenance personnel to quickly ascertain the post-production configuration of a component as it is assembled in a machine. The use of beveled edges and other asymmetries in the prior art has represented an additional manufacturing step and expense that did not improve the overall quality or cost effectiveness of the manufacturing process. As such, an objective of the prior art has traditionally been to eliminate the beveled edge thereby decreasing manufacturing costs.

An asymmetric portion 20 is preferably incorporated in the recess 18. The asymmetric portion 20 is sized to correspond to and mate with the physically asymmetric fiducial marker 6 on the component 2 when the leads 4 are properly aligned for placement on the substrate and the component 2 and nest 12 are brought into contact. Preferably, the component 2, when properly seated in the recess 18, will not extend beyond the nest surface 16. This provides for a digital (on/off) detection scheme in that the component 2 is detected only if the leads are misaligned. Alternatively, the recess 18 can be designed so the component 2 extends beyond the surface 16 to produce a profile characteristic of a component having properly aligned leads. If the component 2 does not properly mate with the recess 18, the component 2 will produce a profile that is not characteristic of a component with properly aligned leads.

The detector 14 of the present invention is positioned relative to the nest 12 to detect the alignment of the leads 4 and provide alignment signals or data indicative of the component alignment. Generally, the lead alignment is detected implicitly by detecting either the orientation of the fiducial marker or the component 2 relative to the nest surface 16. The alignment signal provided by the detector 14 can be used to prompt an operator or as a control signal for additional operations as will be discussed in greater detail within.

Figure 2:
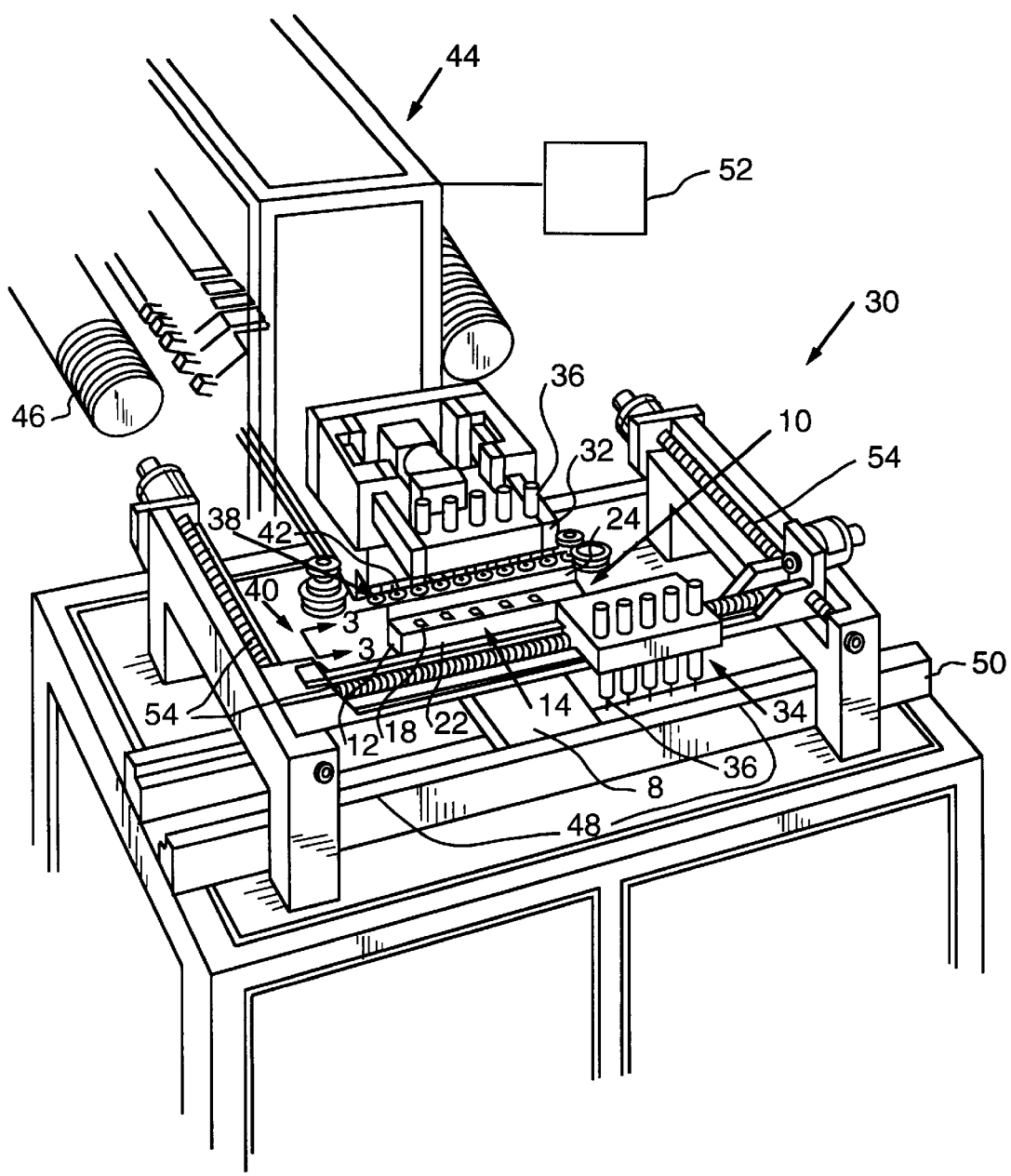
FIG. 2 is an example of a pick and place apparatus incorporating the present invention.

In a preferred embodiment shown in FIGS. 2 and 3, the detector 14 includes an emitter 22 and a receiver 24. The emitter 22 is positioned to emit radiation, preferably visible or infrared light, parallel and proximate to the nest surface 16. The receiver 24 is positioned on a side of the recess 18 opposite the emitter 22 to receive the emitted radiation directed toward the recess 18. The position of the receiver 24 is such that a misalignment of the components will result in a disruption of a radiation pattern received by the receiver 24. The receiver 24, in turn, provides the alignment signals indicative of the component alignment.

The receiver 24 preferably includes a reference radiation pattern for a properly aligned component. The reference pattern is compared with a radiation pattern received by the receiver 24 to determine the lead alignment of the component 2. For example, in the preferred embodiment, the comparison is made to determine the presence or absence of a portion of the component 2 extending beyond the nest surface 16. The absence of the component 2 blocking the emitted signal from the receiver 24 is indicative that the leads of the component in the nest 12 are properly aligned.

Any number of emitter/receiver combinations can be used with the present invention. In an alternative embodiment for the detector 14, shown in FIGS. 4 and 5, a sensor 25 is positioned within the recess 18 at a location to discriminate between components with properly and improperly aligned leads when the nest 12 and the component 2 are brought into contact and provide alignment signals accordingly. The sensor 25 can be one or more of various types of sensors, such as contact, electrical, mechanical, pressure or environmental, but is preferably a vacuum sensor as shown in FIG. 4. It can be appreciated that the sensor can also be used in such conjunction with emitter/receiver detectors 14 such as in FIG. 3.

Figure 7:
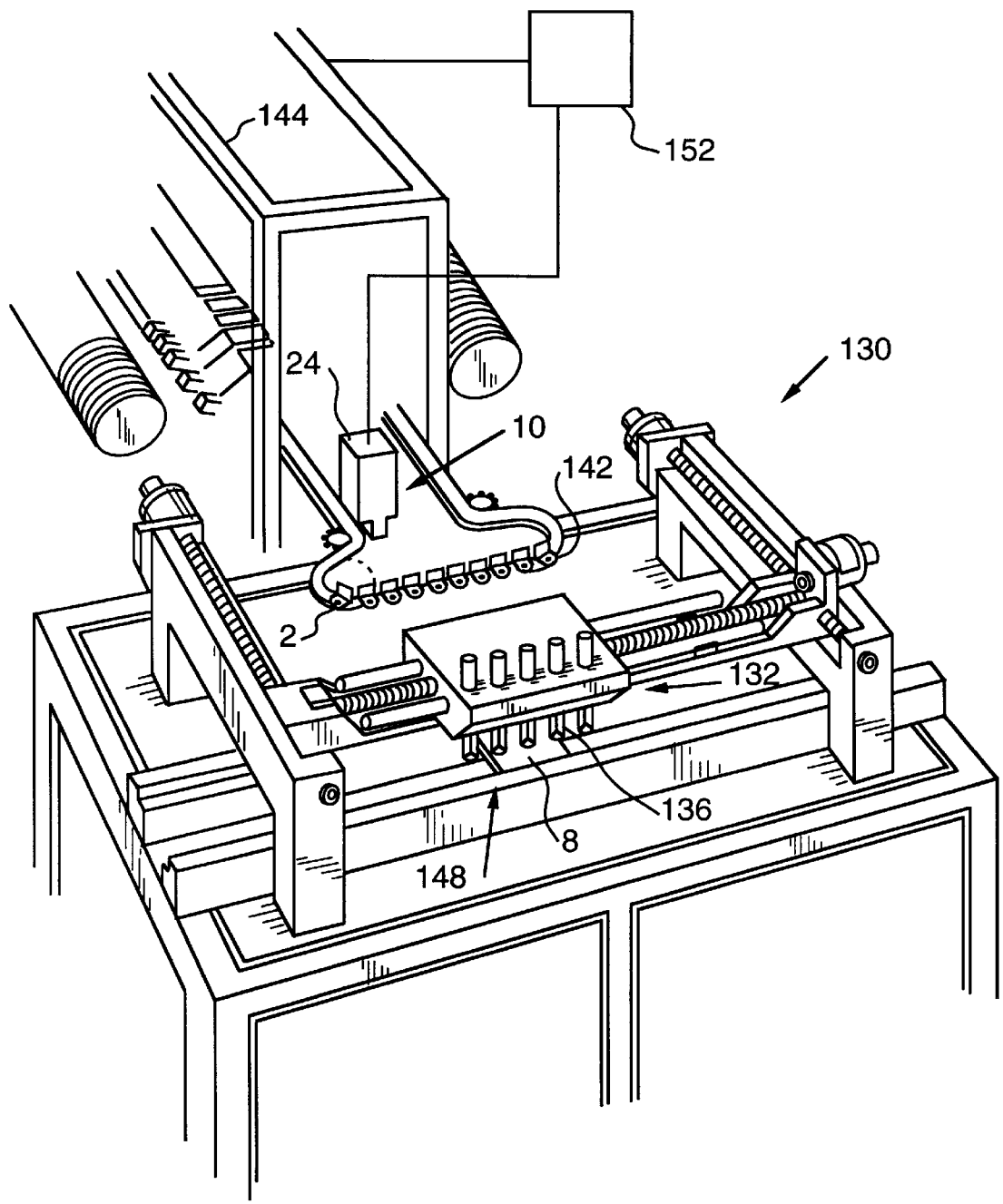

In addition, a receiver 24, such as a camera, can be used that does not require a dedicated emitter. As shown in FIG. 6, a camera 24 can be used as the detector 14 for components having either physical or superficial asymmetric fiducial markers 6 with or without a nest 12. The camera is used to detect both the location and orientation of the fiducial marker 6 for comparison with a properly aligned fiducial marker 6. In this embodiment, a recess in the nest 12 may or may not be used in determining the alignment of the component 2. As shown in FIG. 7, the apparatus 10 can be incorporated into existing machinery through the placement of the camera 24 in a position to detect a fiducial marker indicating the alignment of the leads. One skilled in the art will appreciate that other receivers 24 that do not require dedicated emitters 22 can be similarly incorporated.

In the arrangement of FIG. 6, the detector 14 can be used to facilitate realignment of the component 2 through the use of a movable nest 12 and a feedback system 26. The feedback system 26 controls the movement of the nest 12 based on the comparison of the actual and proper alignment of the fiducial marker 6. The alignment comparison provides an alignment offset for use in correcting the alignment either prior to or during placement of the component 2 on the substrate 8. The feedback system 26 can also be used to halt or alter a process involving the apparatus 10, if the component 2 is misaligned or the alignment of the component 2 can not be determined.

One skilled in the art will appreciate that a feedback system can be implemented in any of the embodiments described herein. For example, a feedback system for components having physical asymmetries may involve picking up and realigning the component 2 to properly seat the component 2 in the nest 12. Alternatively, the nest 12 can be temporarily adjusted to properly seat the component 2 and then readjusted to its properly aligned position prior to removal of the component 2 for further processing.

An exemplary implementation of the apparatus 10 is to modify pick and place machines 30 of the prior art, such as shown in FIG. 2. The machine 30 is further described in the '291 patent, the disclosure of which is hereby incorporated by reference. In this particular embodiment, the machine 30 includes a pick spindle 32 and a placement spindle 34, each of which contains a plurality of pick heads 36.

The pick spindle 32 employs the pick heads 36 to remove components 2 from a pick station 38 and place them in a spindle transfer area 40. Generally, components are continuously fed to the pick station 38 using a continuous track of trays 42 that are supplied from a feed source 44, such as a continuous tape reel 46. The feed source 44 may also include a plurality of serial feed tracks in addition to the single serial feed track shown in FIGS. 2 and 7. The spindle transfer area 40 is accessible by pick heads 36 from both the pick spindle 32 and the placement spindle 34.

The placement spindle 34 employs the pick heads 36 to pick the components 2 from the spindle transfer area 40 and place the components 2 on the substrate 8 positioned in a component mounting position 48. Generally, the substrate 8 will be fed to and removed from the component mounting position 48 along a track 50 in a continuous feed assembly.

The machine 30 generally includes a controller 52 and a number of additional components to bring about high speed movement of components. For example, the machines generally employ a variety of actuators 54 to move the pick heads 36 between pick and place locations.

In a first embodiment shown in FIG. 2, the apparatus 10 is positioned in the spindle transfer area 40. Generally, the apparatus 10 will be connected to the controller 52 and operate to affect the control scheme of the controller 52 in response to alignment signals provided by the detector 14.

Alternatively, the apparatus can have a controller that is independent of the machine controller 52. For example, embodiments of the apparatus 10 employing the feedback system 26 can use the alignment signals to provide continual monitoring of the alignment verification process independent of the machine controller 52. The feedback system 26 communicates with the controller 52 providing misalignment conditions. The controller 52 can be suitably modified to perform any number of actions as specified in response to the alignment signals received either directly from the detector 14 or from the feedback system 26. Such actions include, but are not limited to, repicking the misaligned component using the pick head 36 and replacing it in the nest 12 after realigning the component. Also, the placement spindle can be used to place the misaligned component in a discard area (not shown) or can place the component on the substrate in accordance with an alignment offset required to properly align the leads 4. The alignment offset is determined by comparing the detected alignment with the predetermined alignment for the component having its leads properly oriented.

A general description of the operation of the machine 30 employing the apparatus 10 is provided. Initially, components 2 are fed from the feed source 44 to the pick station 38 via a continuous series of trays 42. The components 2 are picked from trays 42 at the pick station 38 using the pick heads 36 on the pick spindle 32. The pick spindle 32 moves to the spindle transfer area 40 and places the components in the nests 12. Alternatively, the component 2 can be placed into the transfer area 40 and the nest 12 and the component 2 can be brought into contact.

The detector 14 provides alignment signals or data on whether components 2 are properly placed in the nest 12. If the leads 4 on the components 2 are properly aligned, the placement spindle 34 picks the components 2 from the nest 12. The placement spindle moves the components to the mounting position 48 and places the components 2 on the substrate.

An alternative embodiment of the apparatus 10 in a different pick and place machine 130 described in the '291 patent is shown in FIG. 7. Machine elements that are comparable to those in machine 30 have the same last two digits in the reference number. In machine 130, the spindle transfer area 40 and placement spindle 34 used in the embodiment shown in FIG. 2 have been eliminated. The components 2 are picked from trays 142 using pick heads 136 on a pick spindle 132. The pick spindle 132 places the components 2 on the substrate 8 at the component mounting station position 148.

The apparatus 10 is embodied as a receiver 24 positioned relative to the feed source 144 and connected to a machine controller 152. The receiver 24 is used to detect the location of a fiducial marker 6 on the component 2 while the component 2 is in the tray 142. If the leads 4 on the component 2 are not properly aligned, the pick heads can be used to correct the alignment offset of the component or discard the misaligned component. Alternatively, the controller 152 can control the pick spindle 132 to bypass the misaligned component. The misaligned component will be transported away from the pick station 138 in the tray 142. A remote apparatus can be provided to realign or discard the misaligned component.

The positioning of the receiver 24 in the embodiment of FIG. 7 allows one receiver to inspect the components 2 as the components are transported to the pick station 138 on a continuous track. One receiver 24 can then provide lead alignment data for use by the controller 152 in directing pick operations. Also, as discussed above, the receiver 24 can be used to detect both physical asymmetries and superficial asymmetries on the components 2.

One skilled in the art will appreciate the receiver 24 can be arranged in a stationary position relative to the feed source 144 or the receiver 24 can be coupled with the movement of the pick head 36. Also, a plurality of receivers 24 can be used that correspond to one or more of a plurality of pick heads. In addition, components 2 can also be fed to the pick stations using parallel feed sources, which also may be either continuous or discontinuous.

Embodiments similar to FIG. 7 provide substantial flexibility in upgrading existing pick and place machines to incorporate the apparatuses and methods of the present invention. However, those apparatuses perform most reliably if the fiducial marker 6 is visually accessible while the component 2 is in the tray 142. It should be noted that the tray 142 can also be modified to serve as a nest 12 for visually inaccessible physical asymmetries.

Those of ordinary skill in the art will appreciate that a number of modifications and variations that can be made to specific aspects of the method and apparatus of the present invention without departing from the scope of the present invention. Such modifications and variations are intended to be covered by the foregoing specification and the following claims.

What is claimed is:

1. An asymmetric component alignment detection apparatus, comprising:
    a nest including a nest surface containing an asymmetric recess corresponding to the shape of a component;
    a controller; and
    a detector coupled to said controller and focused above and parallel to said nest surface to detect whether the component is completely received in said recess and provide an alignment signal indicative of whether the component was completely received in said recess.

2. The component placement system of claim 1, wherein complete receipt of the component in said recess is detected by comparing a profile characteristic of a portion of the component that protrudes from said recess with a known profile characteristic.

3. The component alignment detection apparatus of claim 1, wherein said detector includes a camera.

4. The component alignment detection apparatus of claim 1, wherein said detector further comprises:
    a receiver located at a side of said recess; and
    an emitter located at a side of said recess opposite said receiver and directed toward said receiver.

5. An asymmetric component alignment detection apparatus, comprising:
    a nest including a nest surface containing an asymmetric recess corresponding to the shape of a component;
    a controller; and
    a detector coupled to said controller and focused above and parallel to said nest surface to detect whether the component is completely received in said recess by comparing a profile characteristic of a portion of the component that protrudes from said recess with a known profile characteristic and provide an alignment signal indicative of whether the component was completely received in said recess.

6. An asymmetric component alignment detection apparatus, comprising:
    a nest including a nest surface containing an asymmetric recess corresponding to the shape of a component;
    a controller; and
    a camera coupled to said controller and focused above and parallel to said nest surface to detect whether the component is completely received in said recess and provide an alignment signal indicative of whether the component was completely received in said recess.

7. An asymmetric component alignment detection apparatus, comprising:
    a nest including a nest surface containing an asymmetric recess corresponding to the shape of a component;
    a controller;
    a receiver located at a side of said recess, coupled to said controller and focused above and parallel to said nest surface to detect whether the component is completely received in said recess and provide an alignment signal indicative of whether the component was completely received in said recess; and
    an emitter located at a side of said recess opposite said receiver and directed toward said receiver.

* * * * *